(12) United States Patent
McCarthy

(10) Patent No.: US 8,299,439 B2
(45) Date of Patent: Oct. 30, 2012

(54) RADIATION DETECTING DEVICE AND METHOD OF OPERATING

(75) Inventor: Michael McCarthy, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 559 days.

(21) Appl. No.: 12/468,615

(22) Filed: May 19, 2009

(65) Prior Publication Data

US 2010/0294946 A1 Nov. 25, 2010

(51) Int. Cl.
*G01T 1/24* (2006.01)
(52) U.S. Cl. .................................. 250/370.05; 250/392
(58) Field of Classification Search ............. 250/370.05, 250/392; 257/252, 634
See application file for complete search history.

(56) References Cited

U.S. PATENT DOCUMENTS

| | | | | |
|---|---|---|---|---|
| 6,075,261 A | * | 6/2000 | Hossain et al. | 257/252 |
| 6,097,079 A | * | 8/2000 | Hossain et al. | 257/634 |
| 7,109,859 B2 | | 9/2006 | Peeters | |
| 7,645,993 B2 | * | 1/2010 | Gazda et al. | 250/370.05 |
| 2008/0191123 A1 | * | 8/2008 | Lutz et al. | 250/208.1 |
| 2009/0166550 A1 | * | 7/2009 | Gazda et al. | 250/392 |

OTHER PUBLICATIONS

AMD MirrorBit White Paper, Publication No. 25260, revision C, amendment 0, issue date Sep. 18, 2002; printed from <www.amd.com/us-en/assets/content_type/white_papers_and_tech_docs/25260C.pdf> on May 19, 2009; 10 pages.

* cited by examiner

*Primary Examiner* — David Porta
*Assistant Examiner* — Casey Bryant

(57) ABSTRACT

A method of operating a radiation-detecting device includes charging a first charge storage region of a charge storage structure to place a first charge value at the first charge storage region, and charging a second charge storage region of the charge storage structure to place a second charge value at the second charge storage region. The method further includes conducting a first read operation to determine a change in the first charge value at the first charge storage region at a first time after charging the first charge storage region, and determining a first radiation flux value for an environment containing the charge storage structure based on the change in the first charge value at the first time.

17 Claims, 3 Drawing Sheets

RADIATION DETECTING DEVICE AND METHOD OF OPERATING

BACKGROUND

1. Field of the Disclosure

The following application is directed to radiation-detecting devices, and more particularly radiation-detecting devices incorporating charge storage structures.

2. Description of the Related Art

Radiation-detecting devices can be used to detect certain types of radiation, however, some may be particularly expensive and cumbersome. For example, conventional neutron detectors generally include a container including a neutron sensitive gas, such as $^3$He or $BF_3$, and an electrically charged wire having leads which extend outside of the container. In operation, incident neutrons react with the gas to produce charged particles which change the electrical potential of the wire. A measurement system coupled to the charged wire measures the electrical pulses and uses this information to indicate the presence of neutrons. Such systems can be inaccurate and are prone to failure. These types of detectors are undesirably bulky and are associated with poor sensitivity resulting from, for example, electronic noise.

Other radiation detecting devices use crystals, such as scintillator materials, that radiate a particular wavelength of light when radiation interacts with the crystal or even store a particular amount of charge when radiation interacts with the crystal. The light or amount of charge stored by the crystal can be used to determine the radiation that was present. However, such systems are fragile given the use of crystalline material, can require advanced signal processing units, and can be quite inaccurate and slow.

SUMMARY

A method of operating a radiation-detecting device includes charging a first charge storage region of a charge storage structure to place a first charge value at the first charge storage region and charging a second charge storage region of the charge storage structure to place a second charge value at the second charge storage region. The method further includes conducting a first read operation to determine a change in the first charge value at the first charge storage region at a first time after charging the first charge storage region, and determining a first radiation flux value for an environment containing the charge storage structure based on the change in the first charge value at the first time.

According to certain embodiments, the method further includes reporting the first radiation flux. Moreover, in certain examples charging the first charge storage region is conducted at a first time, and can further include charging the first charge storage region at a third charge value at a third time after conducting the first read operation. Certain particulars of the method can further include conducting a third read operation to determine a change in the third charge value at the first charge storage region after charging the first charge storage region at the third charge value. Determining a third radiation flux value for the environment based on the change in the third charge value at the first charge storage region may also be completed. Additionally, the third read operation can be conducted at a fourth time.

In some embodiments the method can include comparing the first radiation flux value to a threshold radiation flux value, and identifying a radiation flux value indicator based on the comparison. In certain instances, the third charge value is based upon the radiation flux value indicator.

In particular examples, the method further includes conducting a second read operation to determine a change in the second charge value at the second charge storage region at a second time after charging the second charge storage region. Notably, the second time is different than the first time, and a second radiation flux value can be determined for the environment based on the change in the second charge value for the second time.

According to other particulars, the method can include comparing the first radiation flux value to the second radiation flux value, and identifying a radiation flux value indicator based on the comparison. Certain methods of operation can further include comparing the radiation flux value indicator to a threshold radiation flux value, and generating an alert signal wherein the radiation flux value indicator exceeds the threshold radiation flux value.

In another aspect, a radiation-detecting device includes a first multi-bit storage cell at a substrate having a first charge storage structure comprising a first nitride-containing layer overlying a first channel region at the substrate, a first conductive gate layer overlying the first charge storage structure, and a first source/drain region adjacent the first channel region, wherein a portion of the first source/drain region underlies a portion of the first charge storage structure and a first bit storage region for storing information, wherein the first bit storage region is between the first source/drain region and the first conductive gate layer. The first multi-bit storage cell also includes a second source/drain region adjacent the first channel region, wherein a portion of the second source/drain region underlies a portion of the first charge storage structure and a second bit storage region for storing information, wherein the second bit storage region is between the second source/drain region and the first conductive gate layer. The device can also include a second multi-bit storage cell at the substrate having a second charge storage structure comprising a second nitride-containing layer overlying a second channel region at the substrate, wherein the second nitride-containing layer has a geometry that is significantly different than the first nitride-containing layer and configured to hold a significantly different amount of charge than the first nitride-containing layer of the first charge storage structure, a second conductive gate layer overlying the second charge storage structure, and a third source/drain region adjacent the second channel region, wherein a portion of the third source/drain region underlies a portion of the second charge storage structure and a third bit storage region for storing information, wherein the third bit storage region is between the third source/drain region and the second conductive gate layer. The second multi-bit storage cell further includes a fourth source/drain region adjacent the second channel region, wherein a portion of the fourth source/drain region underlies a portion of the second charge storage structure and a fourth bit storage region for storing information, wherein the fourth bit storage region is between the fourth source/drain region and the second conductive gate layer.

In certain embodiments of the second aspect, the first bit storage region and second bit storage region are contained within the first nitride-containing layer of the first charge storage structure. Moreover, in certain devices, the second nitride-containing layer of the second charge storage structure has an average thickness that is greater than an average thickness of the nitride-containing layer of the first charge storage structure. Additionally, for some devices, the second multi-bit storage cell comprises a second charge storage capacity that is significantly greater than a first charge storage capacity of the first multi-bit storage cell.

In other embodiments of the second aspect, the device further includes a thermalizing layer overlying the first charge storage structure. In particular, the thermalizing layer overlies the second charge storage structure.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE PREFERRED EMBODIMENT(S)

The following is directed to an electronic device capable of detecting radiation. Certain types of radiation particularly suitable for detection by the device include gamma rays, x-rays, beta particles, alpha particles, and neutrons. Additionally, the following is directed to methods of operating such devices, including for example, methods of detecting the radiation, determining a radiation flux of an environment based on the detected radiation, and the like.

Figure 1:
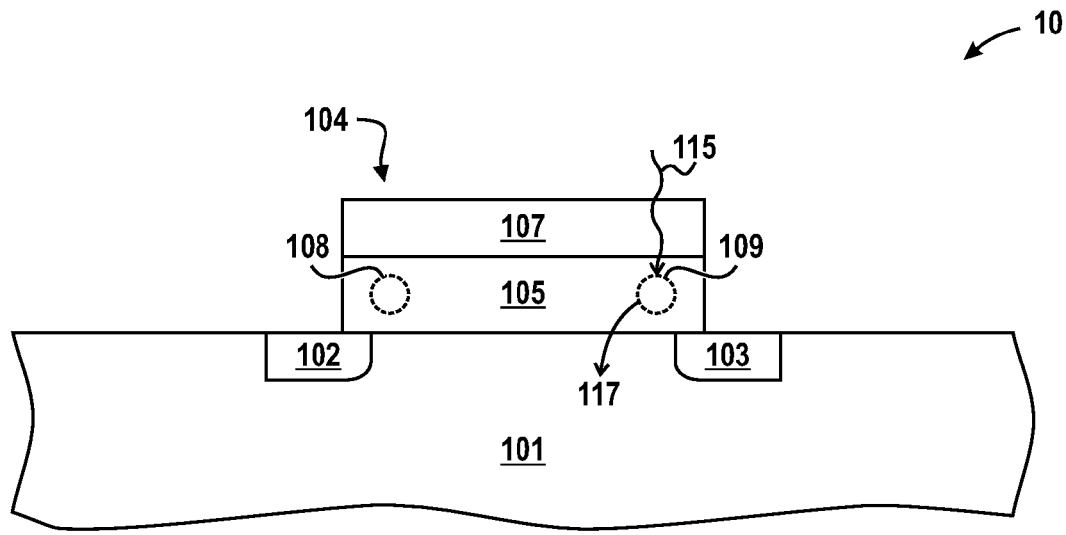
FIG. 1 includes a cross-sectional illustration of a portion of a radiation-detecting device including a charge storage structure in accordance with an embodiment.

FIG. 1 includes a cross-sectional illustration of a portion of a radiation-detecting device 10. As illustrated, the radiation detecting device 10 includes a substrate 101, generally suitable for supporting components. The substrate 101 can include a semiconductor material or insulative material, or any combination thereof. For example, the substrate 101 can include a monocrystalline semiconductor wafer, semiconductor-on-insulator (SOI) wafer, a flat panel display (e.g., a silicon layer over a glass plate), or other substrates conventionally used for electronic devices. In accordance with a particular embodiment, the substrate 101 is made of a single crystal material, such as a single crystal silicon wafer. Furthermore, the substrate 101 can include a dopant, such as including a n-type or p-type dopant. Substrate 101 can include electronic components or portions of electronic components previously formed thereon, including for example, implant regions, field isolation regions, or other layers used to form electronic components.

According to one embodiment, the substrate 101 can include a semiconductor material. Some suitable semiconductor materials can include elements selected from Groups 13, 14, and 15 of the Periodic Table according to the new IUPAC format. For example, certain semiconductive materials can include silicon, germanium, arsenic, gallium, indium, carbon, a combination thereof, and the like.

As further illustrated in FIG. 1, the device 10 comprises a charge storage structure 104 that includes source/drain regions 102 and 103 adjacent to a channel region that can be within the substrate 101 between the source/drain regions 102 and 103. The source/drain regions 102 and 103 can be doped regions of the substrate having a common conductivity type, such as an n-doped region, while the channel region can be a doped region of the opposite conductivity type, such as a p-doped region.

The charge storage structure 104 further includes a series of layers, including layer 105 and a gate 107 overlying the substrate and portions of the source/drain regions 102 and 103. The charge storage structure 104 is part of a device 10 suitable for storing charge and information, such as a transistor gate stack.

As illustrated, the charge storage structure 104 includes a layer 105. Layer 105 can include a material suitable for storing charge. For example, layer 105 can include a dielectric material, such as an oxide, nitride, oxynitride or the like. According to one embodiment, layer 105 can include silicon nitride. Layer 105 can be formed by growth techniques, deposition techniques, and the like. In certain designs, layer 105 can include a plurality of layers, for example layer 105 can include an ONO (oxide-nitride-oxide) layered structure, wherein each of the layers can be formed by growth techniques, deposition techniques, and the like. Particular layered structures (e.g., a ONO layered structure) facilitate a charge storage structure 104 in which the charges in the charge storage layer (e.g., nitride layer) are localized or otherwise trapped at a particular region within layer 105 and do not move freely through the charge storage layer, unlike floating gate charge storage structures. For example, layer 105 can include two separate charge storage regions 108 and 109, each representing a bit storage region that are fixed at discrete locations within layer 105 that are spaced apart from each other. The charge storage region 108 can be located within the layer 105 overlying a portion of the channel close to the source/drain region 102 within the substrate 101 and underlying the gate layer 107, while the charge storage region 109 can be located within the layer 105 overlying a portion of the channel close to the source/drain region 103 within the substrate 101 and underlying the gate layer 107.

Layer 107 can overlie, and in certain instances directly overlie (i.e., abut) the layer 105. Layer 107 can include a semiconductive material, a metal, and the like. Suitable semiconductive materials can include silicon, germanium, gallium, or a combination thereof. In accordance with one particular embodiment, the layer 105 includes a doped polysilicon. Layer 107 can be formed by growth techniques, deposition techniques, and the like.

The device 10 can be used to determine the presence of radiation and to measure the radiation flux of a particular environment. In such environments, radiation 115 can strike the device 10 and particularly the charge storage region 109 of the charge storage structure 104. The charge storage regions 109 can be initially programmed to have a fixed amount of charge (Q). Radiation 115 interacts with the charge storage region 109 in a manner to change the amount of charge stored therein. Without being bound by a single theory, it is believed that radiation affects electrons stored within the charge storage region 109 to result in electrons 117 jumping from the charge storage region 109 to the substrate 101 in the channel region between the source/drain regions 102 and 103. Notably, the change in the amount of charge within the charge storage region 109 can be detected and quantified for a given period of time thereby allowing calculation of the energy (i.e., radiation) received by the device based on the following equation: Energy=$(Q^2/2)(d/\in A)$, wherein d is the effective separation of the charges between the electrons and holes, A is the area of the gate, and $\in$ is the effective permittivity of the layer 105. The manner in which the device is programmed and radiation events are detected are provided in more detail herein.

The type of radiation that can be detected can include radiation that directly interacts with the charges stored within the charge storage regions to affect a change in the amount of charge stored within the charge storage, which typically includes beam-type radiation and/or particle-type radiation. For instance, beam-type radiation can include gamma-ray radiation and x-ray radiation. Particle type radiation can include beta particle radiation, alpha particle radiation, and neutron particle radiation. Notably, in such embodiments, the device may not necessarily need to utilize a radiation-reactive material, such as a material containing certain isotopes (e.g., $^{10}$B, etc.) to facilitate detection of radiation.

Figure 2A:
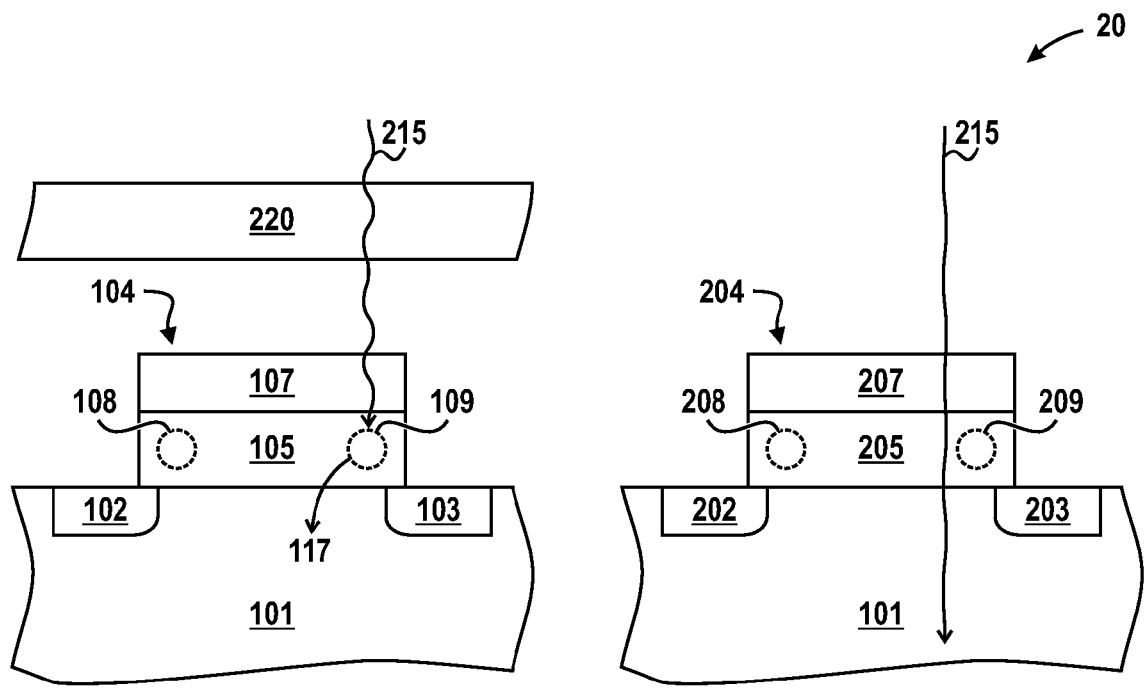
FIG. 2A includes a cross-sectional illustration of a portion of a radiation-detecting device including a first charge storage structure and a second charge storage structure in accordance with an embodiment.

FIG. 2A includes a cross-sectional illustration of a portion of a radiation-detecting device including a first charge storage structure and a second charge storage structure in accordance with an embodiment. In particular, the device 20 of FIG. 2A includes a cross-sectional illustration of a portion of the charge storage structure 104 provided in FIG. 1 and another charge storage structure 204 adjacent the charge storage structure 104. The charge storage structure 204 can be placed on a different chip than the charge storage structure 104, however, in certain cases the charge storage structures 104 and 204 are on the same chip, and in more particular embodiments, the charge storage structures 104 and 204 are part of the same device.

The charge storage structure 204 has the same design as the charge storage structure 104 including source/drain regions 202 and 203 adjacent to a channel region that can be formed within the substrate 101 between the source/drain regions 202 and 203 during operation of the device 10. The source/drain regions 202 and 203 can be doped regions of the substrate 101, and may include n-type dopants or p-type dopants. The charge storage structure 204 further includes a series of layers, including layer 205 and a gate 207 overlying the source/drain regions 202 and 203 of the substrate 101.

As further illustrated in FIG. 2A, the radiation-detecting structure of device 20 can include a layer 220 overlying the charge storage structure 104 that represents a thermalizing material. As used herein, reference to a "thermalizing material" is reference to a material capable of slowing down a particular type of radiation, thus making it more apt to be detected by a charge storage structure associated (e.g., underlying) with the layer containing the thermalizing material. As illustrated, radiation 215 is generated and strikes the layer 220, and based upon the composition of layer 220, the radiation is slowed (i.e., thermalized), which facilitates its interaction with the charge storage region 109 of the charge storage structure 104. By comparison, the same radiation 215 directed towards the charge storage structure 204 may not be slowed since layer 220 is absent, and thus the radiation may pass through the charge storage structure 204 without being detected. Still, it will be appreciated that a layer 220 having the thermalizing material can be formed to overlie all of the charge storage structures 104 and 204 of the device 20.

For example, with respect to certain particle-type radiation, such as neutron radiation, alpha particle radiation, and/or beta particle radiation, the layer 220 can include a polymer.

Some suitable polymer materials include polyolefins, polyamids, polyimids, polyesters, polystyrenes, polycarbonates, polyurethanes, polyethers, polysulphones, polyvinyls, and polyactic acids, or combinations thereof. In some instances, such thermalizing materials may be combined with other materials such as metals, ceramics, polymers, or combinations thereof.

In certain designs, the layer 220 can be made of a thermalizing material including hydrogen-containing materials, deuterium-containing material, and carbon-containing materials, which may be particularly suited for neutron particle detection.

With respect to gamma ray and x-ray radiation, the layer 220 can include a metal, such as a transition metal, and particularly a dense metal material suitable for slowing the high-energy radiation. Suitable metal materials that can be used within the layer 220 include lead, tin, and a combination thereof. In such instances, the layer 220 can be made entirely of the metal material. Alternatively, the layer 220 may be formed to include the metal material as a filler, and accordingly, the layer 220 can include other materials such as polymers and/or ceramics.

Figure 2B:
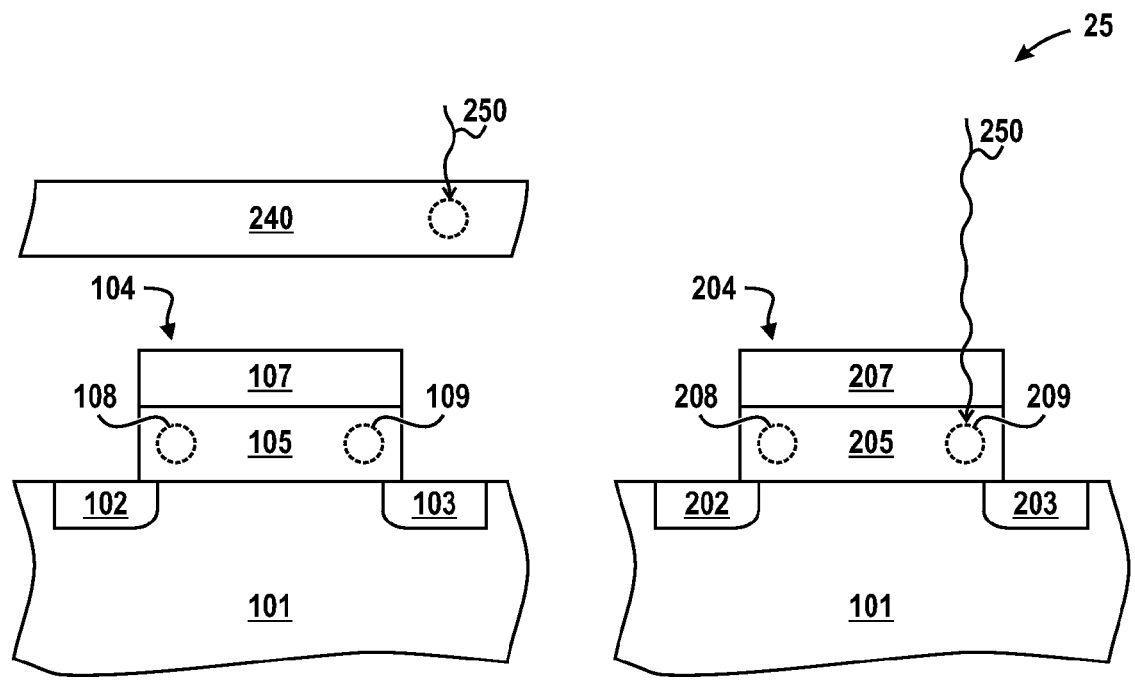
FIG. 2B includes a cross-sectional illustration of a portion of a radiation-detecting device including a first charge storage structure and a second charge storage structure in accordance with an embodiment.

FIG. 2B includes a cross-sectional illustration of a portion of a radiation-detecting device including a first charge storage structure and a second charge storage structure in accordance with an embodiment. In particular, the device 25 of FIG. 2B includes the same charge storage structures 104 and 204 of FIG. 2A. The device 25 further includes a layer 240 selectively overlying a portion of the device such that the charge storage structure 104 is covered by the layer 240 and the charge storage structure 204 is not underlying and thus uncovered by the layer 240. In particular embodiments, the layer 240 can include a shielding material intended to protect certain charge storage structures from one or more types of radiation, such that radiation can not penetrate through the shielding material and interact with an underlying charge storage structure. Suitable shielding materials can include metals, ceramics, or polymers of suitable thickness depending upon the type of radiation that is intended to be absorbed or deflected.

For example, to block the majority of radiation from interacting with a charge storage structure, a dense metal or ceramic material can provide suitable shielding from high energy radiation (e.g., gamma ray radiation). While, polymer materials of certain thicknesses may be suitable for shielding charge storage structures from radiation such as beta particles or alpha particles.

Accordingly, as illustrated, the radiation 250 can be generated and strike the layer 240 including the shielding material and be absorbed or deflected, thus not reacting with the charge storage regions 108 and 109 of the charge storage structure 104. However, with respect to the charge storage structure 204 not underlying the layer 240 having the shielding material, the radiation is free to interact with the charge storage regions 208 and 209 of the charge storage structure 204. Selective covering of portions of the device 25 can facilitate comparisons between the charge storage structures detecting radiation and the charge storage structures not detecting radiation and thus a determination of the type of radiation received. It will be appreciated that a device can include many different layers, each layer can have a different thickness or include a different shielding material, and different layers can selectively overly different charge storage structures.

Figure 3:
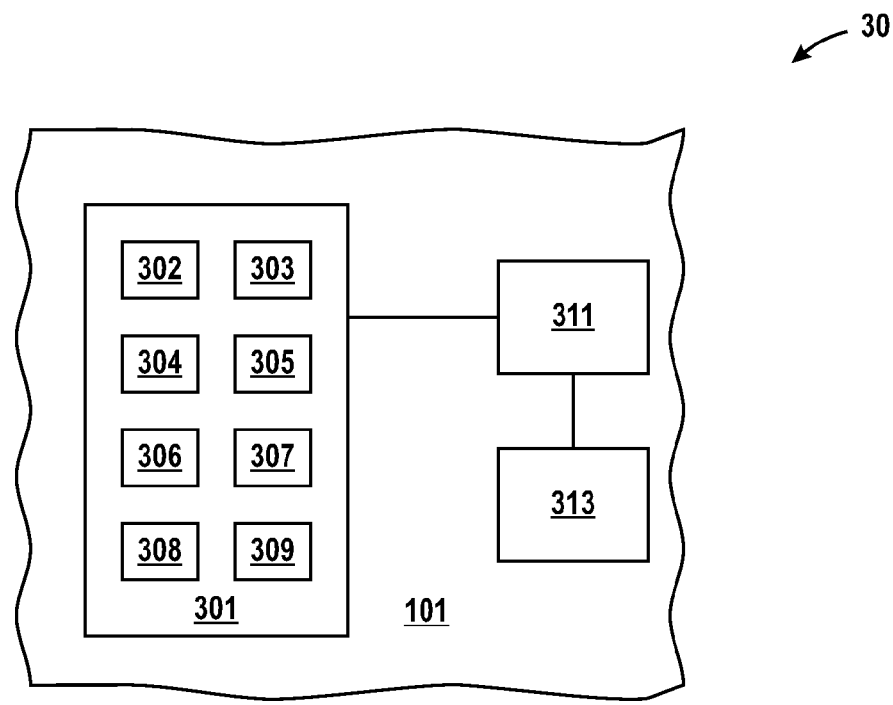
FIG. 3 includes a schematic block diagram of a portion of a radiation-detecting device including an array of charge storage structures in accordance with an embodiment.

FIG. 3 illustrates a portion of a radiation-detecting device 30 that detects radiation. Specifically, the radiation-detecting device 30 includes a radiation-detecting structure 301 including an array of charge storage structures 302, 303, 304, 305, 306, 307, 308, 309 (302-309), a control module 311 (i.e., a digital signal processor) a timer module 313, and a logic module 315.

Notably, the radiation-detecting structure 301 can be a memory array including as illustrated an array of charge storage structures 302-309. For instance, the memory array can be a non-volatile memory array. It will be appreciated, that a non-volatile memory is a device that maintains a programmed state in the absence of a radiation event when there is no power to the device.

The device 30 represents an integrated circuit device, whereby the elements illustrated are integrated at a common substrate 101, such as a semiconductor substrate. The device 30 can include a control module 311 that can be used to control various portions of device 30, including determine a state of each of the charge storage structures 302-309. Depending upon the operation of the device, addressed in more detail herein, the control module 311 can provide control signals to the storage structures 302-309 to determine whether or not a transistor associated with a specific charge storage structure is in a conductive or non-conductive state for a specific read voltage applied at the control gate of the charge storage structure. By determining whether any one of the charge storage structures 302-309 is in a different conductive state than expected, the presence of radiation can be determined and a radiation flux calculated.

The control module 312 can include a timer module 313 to control when periodic accesses to the radiation-detecting structure 301 are made or to maintain a count (e.g., track a time or duration). When the charge storage structures 302-309 are non-volatile devices, power does not need to be applied to the radiation-detecting structure 301 until a read operation is conducted, because the charge storage structures 302-309 do not need to be powered to have their charges modified by a radiation event. Instead, for certain modes of operation the array of charge storage structures 302-309 may only need to be powered when the information at the array of charge storage structures 302-309 is being accessed, or when a portion of the device 30, such as the timer module 313, needs to be active.

In reference now to the contemplated modes of operation, generally the device 30 may be operated in one of a few different modes or combination of modes. Each of the modes of operation are directed towards determining the amount of charge remaining at the charge storage region after programming the charge storage region with a known amount of charge to detect the change in charge and calculate the amount of radiation received for a known amount of time.

According to one mode of operation, each of the charge storage regions within each of the charge storage structures 302-309 can be programmed to particular state using a set of programming voltages such that each of the charge storage regions is programmed to have substantially the same amount of charge (i.e., a programmed charge value) that is known. After programming the charge storage regions, each of the regions can undergo read operations at various times, such as at predetermined intervals, to determine if there has been a change in their programmed state. The read intervals, that is the duration between subsequent read operations, can be controlled by the timer module 313. The read operation can be conducted based upon a single read voltage that applies a single, standard read voltage to the device to determine if a charge storage region has changed state, e.g. from a conductive state to a non-conductive state for a giving read voltage. A change of state indicates a change in the programmed charge value initially stored within the charge storage region (i.e., the programmed charge value) has occurred.

If a change in the programmed charge value is detected at a charge storage region, the value of the change in the amount of charge can be calculated based upon the known difference between the programmed charge value and the charge value necessary to cause a detectable change in state based upon the standard read voltage. This charge value can be used to determine the amount of radiation necessary to cause the change in charge based on the equation provided herein. The radiation flux can be calculated based on the energy received over a period of time. In this mode of operation, the period of time can be the duration between read operations needed to detect a change in the state of the charge storage region. Such calculations can be performed by the logic module 315.

After detecting a change in state, the charge storage region can be reprogrammed to a known charge state, that is, a reprogrammed charge value. In certain instances reprogramming includes applying the same program signals as provided in the initial programming operation (i.e., the programmed charge value). However, in certain embodiments, the reprogrammed charge value can be different than the programmed charge value, which will be discussed in more detail herein.

Another method of operating the device 30 includes programming the charge storage regions of the charge storage structures 302-309 to a known programmed charge value as described above. After programming each of the charge storage regions, read operations can be conducted at regular intervals on each of the devices, however, in this mode of operation, the reading operation measures the resulting channel current for a specific charge storage region. In such modes, a known read voltage is applied to a charge storage structure, and the amount of current that is generated in response to the applied voltage can be measured, for example, by a set of sense amps for a given charge storage region. The measured current can then be associated with a known amount of charge for the given charge storage region, which in turn can be calculated into a received amount of radiation, if any, based upon the change in the amount of stored charge. According to this method, a change of logic state is not necessary to detect a radiation event. Rather, the measured current is used to determine the amount of charge, and therefore, depending upon the sensitivity of the sense amps used, the amount of charge for a given charge storage region may be measured more accurately than the method of detecting a change in state.

For this mode of operation, if a significant change in the charge value is detected from the programmed charge value, the charge storage region can be reprogrammed as described above.

According to another method of operating the device 30, each of the charge storage structures 302-309 can be programmed to a known programmed charge value as described herein. After programming each of the charge storage structures 302-309, read operations can be conducted at regular intervals for each of the charge storage regions. However, a read operation for one charge storage region can include the use of a series of reads, wherein each read uses a different read voltage to detect the read voltage where a change in logic state occurs. For example, a first read can be conducted at a first read voltage ($V_{R1}$), and depending upon whether a change in state (e.g., the first read voltage was sufficient to place the storage structure in a conductive state) is detected based upon the first read voltage, a second read process is conducted at a second, different read voltage ($V_{R2}$). The operation can continue using a number of different read processes, each using a different read voltage, until a change in state is detected. Once a change in state is detected, an associated charge for a given charge storage region can be determined based on the difference between the programmed charge value and the charge value associated with a particular read voltage.

Based upon the read voltage that causes a change in state of the charge storage structure, the difference between the programmed charge value and the read charge value of the charge storage region can be calculated, and the difference in charge value can be used to calculate the radiation flux as described herein. After conducting the read operation, the given charge storage region may be reprogrammed as described herein.

For each of the methods of operating the device 30 described herein, the calculated radiation flux value based upon one or more charge storage regions can be identified by a radiation flux value indicator. In some instances, the radiation flux value indicator can be an indicia associated with a comparison of the calculated radiation flux value to another radiation flux value over a known amount of time. For example, the calculated radiation flux value for a given time based upon a change of charge at a charge storage region can be compared to a threshold radiation flux value. Depending upon the comparison, the radiation flux value indicator may generate an alert signal, especially in such instance where the radiation flux value indicator represents a radiation flux value that exceeds the threshold radiation flux value.

Each of the radiation flux value indicators are associated with a particular charge storage region and can be stored in a memory for data logging. In particular architectures, each of the radiation flux value indicators associated with a calculated radiation flux can be reported. Reporting can include generating a signal to other devices, such as local or remote devices, which can save the signals and or data.

In other embodiments, the calculated radiation flux value based upon a first charge storage region can be compared to the calculated radiation flux value of the same charge storage region for a different (e.g., previous) read operation and identified by a radiation flux value indicator. Comparison of the measured radiation flux values for the same charge storage regions facilitates logging of radiation fluxes for the environment over extended durations and aids identification of patterns or trends. Additionally, comparison of calculated radiation flux values for the same charge storage region can also be used a trouble-shooting operation to identify charge storage structures that may not be operating properly, and may be disengaged from operations if the structure is associated with an undue number of "false counts". The radiation flux value indicators for such comparisons can be used to generate an alert signal and can be stored in a memory.

As described herein, the read interval for the charge storage structures can be a periodic interval. However, in some instances, the read interval can be different. In particular, the read interval can be changed based upon the radiation flux value indicator. For example, if the radiation flux value indicator is associated with no detected radiation flux for a given number of read operations, the read interval can be increased such that the time between subsequent read operations is increased. In other instances, if the radiation flux value indicator indicates a high radiation flux in the environment, the read interval can be decreased. Such changes in the read interval can be associated with a single charge storage region of a single charge storage structure, or alternatively, can include a change for multiple charge storage structures or even all charge storage structures within the device 30.

Moreover, the read interval for one charge storage structure can be different than the read interval for another charge storage structures within the device 30. A difference in read intervals for different charge storage structures facilitates a wider variety of sampling of the radiation within the environment and may provide more accurate readings.

Generally, each of the charge storage regions of the charge storage structures 302-309 can be programmed at the same, known programmed charge value. However, in some instances, the programmed charge value between different charge storage structures 302-309 can be different. Programming different charge storage structures to have different programmed charge values may facilitate a wider variety of data regarding the radiation flux of the environment and therefore more accurate measurements of the calculated radiation flux.

Additionally, the programmed charge value of a charge storage region for a given charge storage structure can be different than a reprogrammed charge value. In certain instances, the reprogrammed charge value can be based upon the radiation flux value indicator based upon a given charge storage structure. That is, the charge value stored at a charge storage region can be changed from the initial programmed charge value during a reprogramming operation depending upon the radiation flux value indicator. For example, the radiation flux value indicator can have a value that indicates a greater amount of charge to be stored at the charge storage structure during a reprogramming operation. Alternatively, the radiation flux value indicator can have a value dictating a lesser amount of charge to be stored at the charge storage structure during a reprogramming operation.

Figure 4:
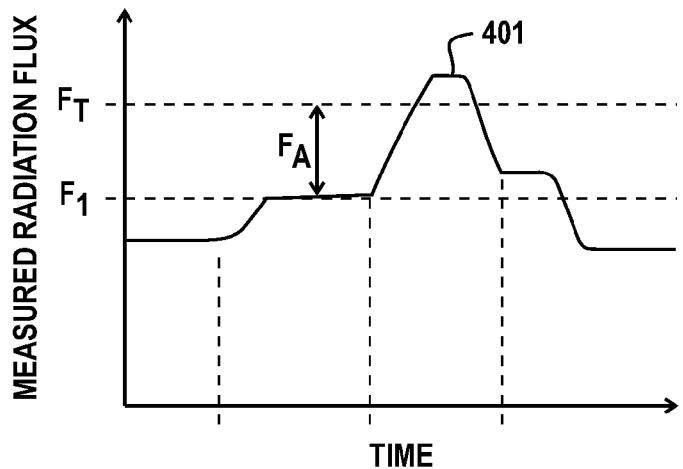
FIG. 4 includes a plot of radiation flux versus time for an environment, wherein the measured radiation flux is measured by a radiation-detecting device in according with an embodiment.

FIG. 4 includes a plot of radiation flux versus time for an environment, wherein the measured radiation flux is measured by a radiation-detecting device in accordance with an embodiment. FIG. 4 represents a plot that can be generated based upon the measured radiation flux for a given environment. In particular, the radiation-detecting devices of embodiments herein facilitate the formation and real-time monitoring of radiation flux for a given environment containing the device. As mentioned previously and illustrate in FIG. 4, the devices herein facilitate the monitoring of radiation flux values, which can include monitoring and generation of alerts when a radiation flux for a given environment exceeds a given threshold voltage ($F_T$) such as within region 401. Moreover, real-time monitoring and data collection capabilities facilitate evaluation of patterns and trends which may have application in a variety of industries.

Figure 5:
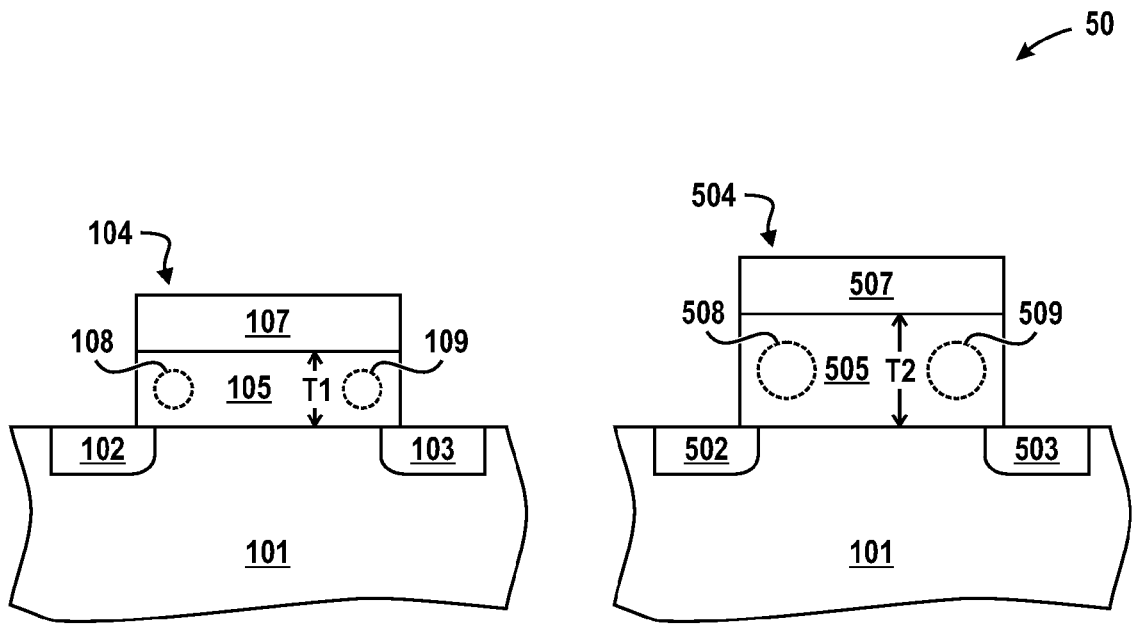
FIG. 5 includes a cross-sectional illustration of a portion of a radiation-detecting device including a first charge storage structure and a second charge storage structure in accordance with an embodiment.

FIG. 5 includes a cross-sectional illustration of a portion of a radiation-detecting device including a first charge storage structure and a second charge storage structure in accordance with an embodiment. The radiation-detecting device 50 can include two different types of charge storage structures 104 and 504. Notably, the charge storage structures 104 and 504 include all of the same features, however, the average thickness of the charge storage layer 105 of the charge storage structure 104 is significantly different than the average thickness of the charge storage layer 505 of the charge storage structure 504. In particular, the charge storage structure 504 has a charge storage layer 505 having an average thickness that is significantly greater than the average thickness of the charge storage layer 105 of the charge storage structure 104. The difference in thickness between the charge storage layers 105 and 505 facilitates a difference in the amount of charge that can be stored at respective charge storage regions, that is regions 108 and 109 and regions 508 and 509, for the respective structures. The capability to store different amounts of charge at different regions facilitates a greater variety in the sampling of the environment, which facilitates greater accuracy in measurements.

According to one embodiment, the device 30 includes an array of charge storage structures 302-309 wherein a portion of the charge storage structures 302-309 can have a charge storage layer having a first average thickness and another portion of the charge storage structures 302-309 (different than the first portion) can have a second average thickness of the charge storage layer, wherein the first and second average thickness are different. Such configurations may increase the sensitivity of the device.

The embodiments herein describe radiation-detecting devices capable of detecting radiation based upon particular methods of operation. In particular, the embodiments herein include a multi-bit storage cell capable of a combination of various operations such as programming, reading and reprogramming operations to detect radiation, calculate the amount of radiation flux, and provide real-time monitoring and alerts of the radiation flux within the environment.

The above-disclosed subject matter is to be considered illustrative, and not restrictive, and the appended claims are intended to cover all such modifications, enhancements, and other embodiments, which fall within the true scope of the present invention. Thus, to the maximum extent allowed by law, the scope of the present invention is to be determined by the broadest permissible interpretation of the following claims and their equivalents, and shall not be restricted or limited by the foregoing detailed description.

The Abstract of the Disclosure is provided to comply with Patent Law and is submitted with the understanding that it will not be used to interpret or limit the scope or meaning of the claims. In addition, in the foregoing Detailed Description of the Drawings, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all features of any of the disclosed embodiments. Thus, the following claims are incorporated into the Detailed Description of the Drawings, with each claim standing on its own as defining separately claimed subject matter.

What is claimed is:

1. A method of operating a radiation-detecting device comprising:
    charging a first charge storage region of a charge storage structure to place a first charge value at the first charge storage region;
    charging a second charge storage region of the charge storage structure to place a second charge value at the second charge storage region;
    determining, at a first time, a third charge value at the first charge storage region by determining an amount of current generated by the charge storage structure responsive to a applying a predetermined voltage to the first charge storage structure;
    determining a first received amount of radiation based upon the first charge value and the third charge storage value; and
    determining a first radiation flux value for an environment containing the charge storage structure based on the first received amount of radiation.

2. The method of claim 1, further comprising reporting the first radiation flux.

3. The method of claim 1, wherein charging the first charge storage region is conducted at a second time.

4. The method of claim 3, further comprising charging, at a third time after determining the first received amount, the first charge storage region to place a fourth charge value at the first charge region.

5. The method of claim 4, further comprising conducting a third read operation to determine a change in the third charge value at the first charge storage region.

6. The method of claim 5, further comprising determining a second radiation flux value for the environment based on the change in the third charge value at the first charge storage region.

7. The method of claim 5, wherein determining the second radiation flux value is conducted at a fourth time.

8. The method of claim 4, further comprising:
    comparing the first radiation flux value to a threshold radiation flux value; and
    identifying a radiation flux value indicator based on the comparison.

9. The method of claim 1, further comprising determining a fourth charge value at the second charge storage region, at a second time after charging the second charge storage region, and determining a second received amount of radiation based on the fourth charge value and the second charge value.

10. The method of claim 9, wherein the second time is different than the first time.

11. The method of claim 9, further comprising determining a second radiation flux value for the environment based on the second received amount of radiation.

12. The method of claim 11, further comprising:
    comparing the first radiation flux value to the second radiation flux value; and
    identifying a radiation flux value indicator based on the comparison.

13. The method of claim 12, further comprising:
    comparing the radiation flux value indicator to a threshold radiation flux value; and
    generating an alert signal wherein the radiation flux value indicator exceeds the threshold radiation flux value.

14. The method of claim 1, wherein determining the third charge value comprises the use of a series of reads, each read of the series using a different read voltage.

15. The method of claim 1 further comprising: determining a third time based on the first received amount of charge; and determining, at the third time, a third charge value at the first charge storage region.

16. A method of operating a radiation-detecting device comprising:
    charging a first charge storage region of a charge storage structure to place a first charge value at the first charge storage region;
    charging a second charge storage region of the charge storage structure to place a second char value the second charge story region
    determining, at a first time, a third charge value at the first charge storage region by determining an amount of current generated by the charge storage structure responsive to applying a predetermined voltage to the first charge storage structure;
    determining a first received amount of radiation based upon the first charge value and the third charge storage value;
    determining a first radiation flux value for an environment containing the charge storage structure based on the first received amount of radiation;
    determining a fourth charge value based upon the first received amount of charge, the fourth charge value different than the first charge value;
    charging the first charge storage region to the fourth charge value;
    determining, at a second time, a fifth charge value at the first charge storage region; and determining a second received amount of radiation based upon the fourth charge value and the fourth charge storage value.

17. A method of operating radiation-detecting device comprising:

charging a first charge storage region of a charge storage structure to place a first charge value at the first charge storage region, the first charge storage structure has a first thickness;

charging a second charge storage region of the charge storage structure to place a second charge value at the second charge storage region;

determining, at a first time, a third charge value at the first charge storage region by determining an amount of current generated by the charge storage structure responsive to applying a predetermined voltage to the first charge storage structure;

determining a first received amount of radiation based upon the first charge value and the third charge storage value; and determining a first radiation flux value for an environment containing the charge storage structure based on the first received amount of radiation;

charging a third charge storage region of a charge storage structure having a second thickness, different than the first thickness; and determining a second received amount of radiation at the third charge storage region.

* * * * *